(12) United States Patent
Nguyen et al.

(10) Patent No.: US 7,983,039 B1
(45) Date of Patent: Jul. 19, 2011

(54) REVERSIBLE AIRFLOW FAN TRAY DESIGN FOR ELECTRONIC DEVICE IN A DATA CENTER

(75) Inventors: Tri Luong Nguyen, San Jose, CA (US); Hogan Lew, Sunnyvale, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 196 days.

(21) Appl. No.: 12/491,808

(22) Filed: Jun. 25, 2009

(51) Int. Cl.
*H05K 7/20* (2006.01)
(52) U.S. Cl. .......................... 361/695; 361/694; 454/184
(58) Field of Classification Search .................. None
See application file for complete search history.

(56) References Cited

U.S. PATENT DOCUMENTS

| | | | |
|---|---|---|---|
| 5,949,646 A * | 9/1999 | Lee et al. ...................... 361/695 |
| 6,071,082 A * | 6/2000 | Lecinski et al. ................ 417/53 |
| 6,638,016 B1 * | 10/2003 | Mease et al. ............... 415/214.1 |
| 6,717,809 B2 * | 4/2004 | Chen et al. .................... 361/695 |
| 6,735,081 B1 * | 5/2004 | Bishop et al. ................. 361/695 |
| 7,434,743 B2 * | 10/2008 | Barsun et al. ................. 236/49.3 |
| 7,492,591 B1 * | 2/2009 | Aybay et al. ................... 361/695 |
| 7,719,848 B2 * | 5/2010 | Widmayer et al. ............ 361/752 |
| 7,729,116 B1 * | 6/2010 | Aybay et al. .................. 361/695 |
| 7,804,686 B2 * | 9/2010 | Parish et al. ................... 361/696 |
| 2002/0094282 A1 * | 7/2002 | Bendikas et al. ............... 417/360 |
| 2004/0202541 A1 * | 10/2004 | Stewart et al. ............. 415/213.1 |
| 2008/0124234 A1 * | 5/2008 | Echazarreta ............ 417/423.14 |

* cited by examiner

*Primary Examiner* — Gregory D Thompson
(74) *Attorney, Agent, or Firm* — Harrity & Harrity, LLP

(57) ABSTRACT

A reversible airflow fan tray assembly is provided for an electronic device. The fan tray assembly includes a face plate to be removably mounted to the electronic device and a fan tray cassette to be removably mounted to the face plate in multiple orientations. The fan tray cassette includes a fan unit to provide airflow through the electronic device, and an interconnection board to provide an electrical connection between the fan unit and the electronic device, where the interconnection board mates with a connector on the electronic device when the fan tray cassette is in any of the multiple orientations. The interconnection board provides an airflow direction indication to the electronic device for a current orientation of the multiple orientations.

20 Claims, 9 Drawing Sheets

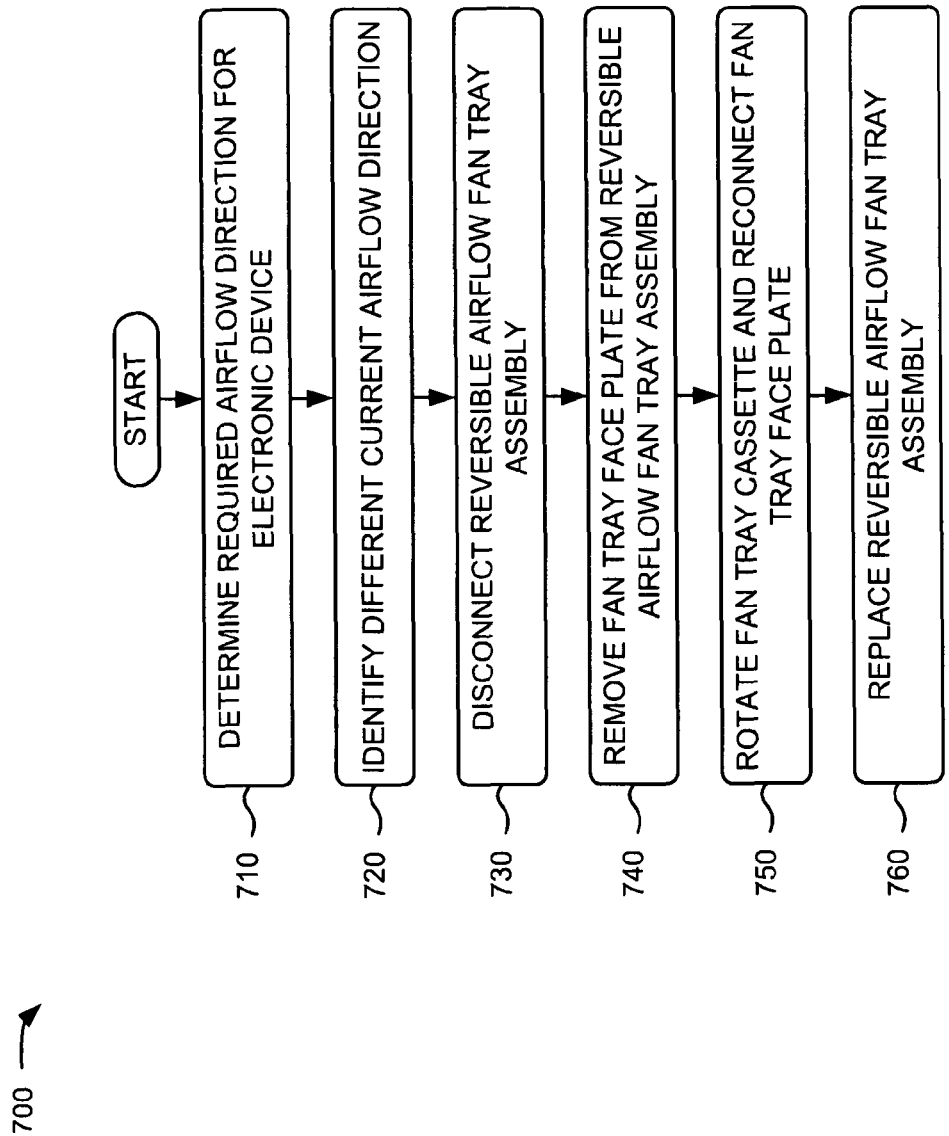

US 7,983,039 B1

REVERSIBLE AIRFLOW FAN TRAY DESIGN FOR ELECTRONIC DEVICE IN A DATA CENTER

BACKGROUND

Electronic devices may be used in many types of systems and/or applications, such as control systems, data processing systems, medical systems, telecommunication systems and/or communication networks. Electronic devices may include system controllers, servers, and/or network devices, such as routers, switches, firewalls, and/or network address translators.

In data centers, electronic devices may be installed within a networking rack to provide, for example, a scalable system. Electronic devices may be arranged within the rack to provide optimum connectivity with other electronic devices. In addition, airflow direction in networking racks is typically required to go from a cold side to a hot side. Scalable electronic devices may be designed to accommodate certain changes. It may be required to change the arrangement of electronic devices within a networking rack to accommodate new application requirements. Specifically, the orientation of the equipment may need to change to locate the ports on one side or the other of the networking rack.

SUMMARY

In one implementation, a reversible airflow fan tray device may be provided for an electronic device. The fan tray device may include a face plate to be removably mounted to the electronic device and a fan tray cassette to be removably mounted to the face plate in multiple orientations. The fan tray cassette may include a fan unit to provide airflow through the electronic device, and an interconnection board to provide an electrical connection between the fan unit and the electronic device, where the interconnection board can mate with a connector on the electronic device when the fan tray cassette is in any of the multiple orientations.

In another implementation, an electronic device may be provided. The electronic device may include an enclosure to retain components of the electronic device; a fan tray assembly removably mounted to the enclosure of electronic device, where the fan tray assembly may be positioned in either of two orientations, the first orientation to draw external air into the electronic device and the second orientation to force internal air out of the electronic device; and a main system board operatively connected to the reversible fan tray assembly to identify which of the first and second orientations is currently installed.

In a further implementation, a fan tray assembly may be provided. The fan tray assembly may include means for removably mounting the fan tray assembly to an electronic device; means for operatively connecting the fan tray assembly to the electronic device in a first orientation, where the first orientation provides airflow through the electronic device in one direction; means for operatively connecting the fan tray assembly to the electronic device in a second orientation, where the second orientation provides airflow through the electronic device in another direction; and means for providing an airflow direction indication to the electronic device for the first orientation or the second orientation.

In yet another implementation, a method for reversing airflow through an electronic device having a reversible fan tray assembly may be provided. The method may include determining an airflow direction for the electronic device; identifying a different current airflow direction for the electronic device; and disconnecting the reversible fan tray assembly from the electronic device. The method may further include removing a fan tray face plate from a first orientation of the reversible fan tray assembly; securing the fan tray face plate on a second orientation of the reversible fan tray assembly; and reconnecting the reversible airflow assembly to the electronic device.

BRIEF DESCRIPTION OF THE DRAWINGS

The accompanying drawings, which are incorporated in and constitute a part of this specification, illustrate one or more implementations described herein and, together with the description, explain these implementations. In the drawings:

FIG. 7 is a flowchart of an exemplary process for reversing the air flow for an electronic device according to implementations described herein.

DETAILED DESCRIPTION

The following detailed description refers to the accompanying drawings. The same reference numbers in different drawings may identify the same or similar elements. Also, the following detailed description does not limit the invention.

Implementations described herein may provide a reversible airflow fan tray for electronic devices. The reversible airflow fan tray may include a face plate, a symmetrical fan cassette, and a cable harness. The face plate may provide a base to mount and secure other components of an electronic device. The fan cassette may house multiple fans and may be mounted to the face plate in either of two orientations, each orientation providing airflow in an opposite direction. The interconnection board may provide an electrical connection between the multiple fans and a main system board of the electronic device. The interconnection board may be configured to mate with a connector on the main system board when the fan tray cassette is in either orientation, and the interconnection board may provide an airflow direction indication to the main system board.

Exemplary Electronic Device

Figure 1:
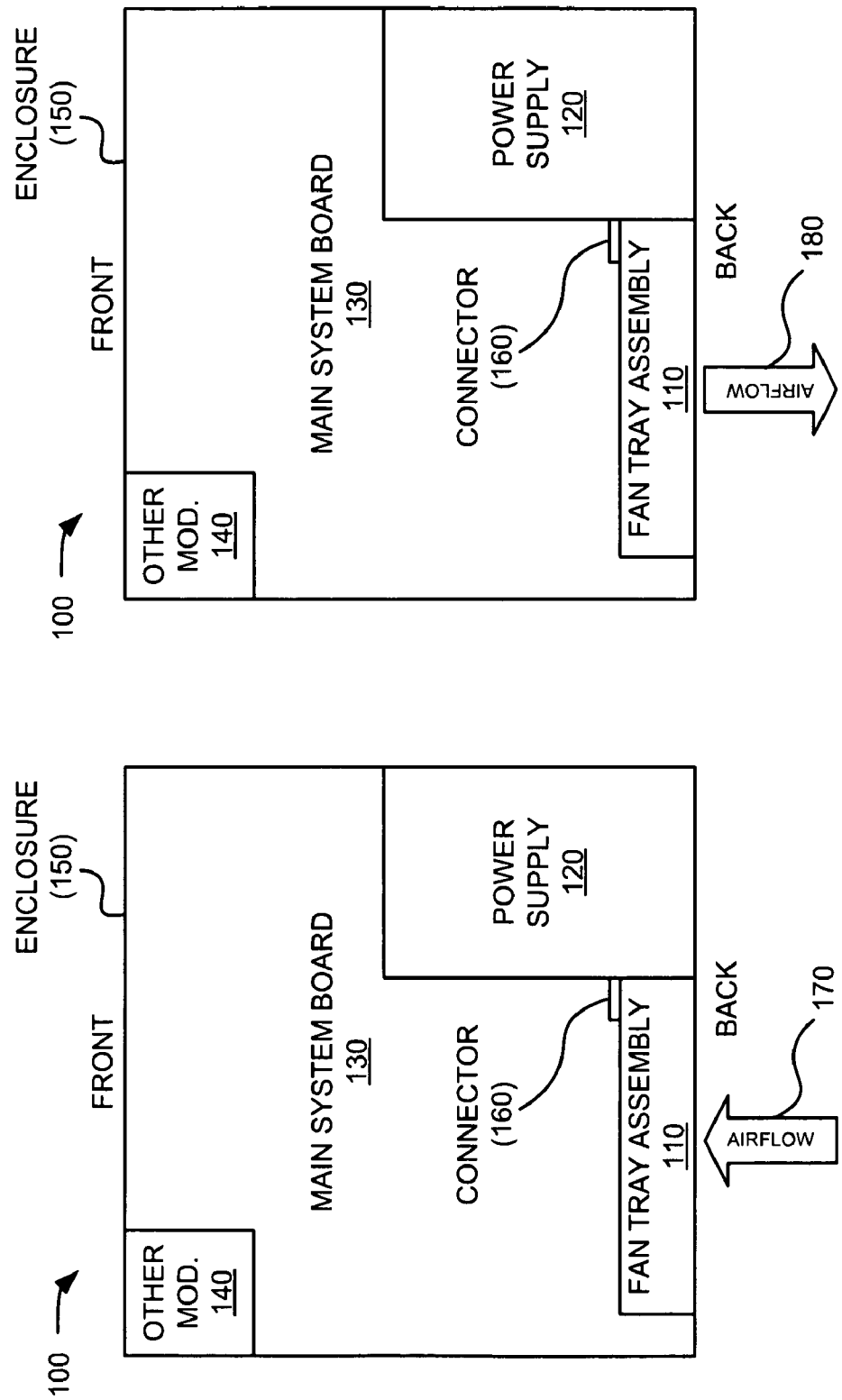
FIGS. 1A and 1B illustrate a top view of an exemplary electronic device in which a reversible airflow fan tray may be implemented.

FIGS. 1A and 1B illustrate a top view of exemplary electronic device 100 in which a reversible airflow fan tray may be implemented. In implementations herein, electronic device 100 may take the form of a system controller, a server, a router, a switch, a firewall, a network address translator and/or another network device. In another implementation, electronic device 100 may be a non-networking device. As shown in FIGS. 1A and 1B, electronic device 100 may include a reversible fan tray assembly 110, a power supply 120, a main system board 130, one or more other modules 140, and an enclosure 150.

Fan tray assembly 110 may provide a reversible fan unit that may be installed in either of two orientations within electronic device 100. Fan tray assembly 110 may be operatively connected to a connector 160 that allows main system board 130 to communicate with fan tray assembly 110 and provides power (e.g., from power supply 120) to fan tray assembly 110. Depending on the orientation of installation, fan tray assembly 110 may provide air flow in different directions. As shown in FIG. 1A, in one orientation, fan tray assembly 110 may draw air into the back of electronic device 100 (illustrated by airflow indicator 170). As shown in FIG. 1B, in another orientation, fan tray assembly 110 may force air out of the back of electronic device 100 (illustrated by airflow indicator 180). Further details of interconnection board 130 are provided below in connection with, for example, FIG. 3.

Power supply 120 may include any device capable of providing power to devices operating in electronic device 100, such as fan tray assembly 110, main system board 130, other modules 140 and/or other components of electronic device 100. Power supply 120 may be configured to perform voltage and/or current conversion and may include one or more inputs and/or outputs. In one implementation, power supply 120 may accept an alternating current (AC) from a wall receptacle and provide a direct current (DC) to devices operating within electronic device 100. Power supply 120 may also include a mechanism (e.g. a fan or blower) to provide airflow for cooling power supply 120.

Main system board 130 may include a main system board of electronic device 100. Main system board 130 may perform a variety of processing functions associated with the intended purpose of electronic device 100 (e.g., system controller, server, network device, etc.). Main system board 130 may also include various connectors to operatively connect main system board 130 to other components of electronic device 100. One such connector, connector 160, may operatively connect fan tray assembly 110 to main system board 130. In implementations described herein, main system board 130 may monitor orientations of components within electronic device 100 (e.g., fan tray assembly 110, power supply 120, etc.) to ensure consistent airflow through electronic device 100. Based on a connection of fan tray assembly 110 to connector 160, main system board 130 may determine an existing airflow direction for fan tray assembly 110. Main system board may use this information, for example, to recognize and provide a warning of inconsistent airflow directions within an individual electronic device 100 and/or within a networking rack of electronic devices 100.

Other modules 140 may include one or more switches, communication ports, cards, transceivers, and/or other modules that may change or enhance capabilities of electronic device 100. Other modules 140 may be optional components.

Enclosure 150 may include any structure that can be configured to act as a housing to retain and/or protect fan tray assembly 110, power supply 120, main system board 130, other modules 140, and/or other components that may be used to facilitate operation of electronic device 100. Enclosure 150 may be fabricated from metal, plastic and/or composite and may be sized for particular applications. In one implementation, enclosure 150 may be sized to fit an industry standard mounting structure, such as a networking rack. Enclosure 150 may include one or more mounting flanges (not shown) to facilitate attachment of enclosure 150 to a mounting structure, such as a networking rack. The mounting flange may include one or more mounting holes for accepting fasteners, such as machine screws, for use in attaching electronic device 100 to the mounting structure.

Although FIGS. 1A and 1B show exemplary components of electronic device 100, in other implementations, electronic device 100 may contain fewer, different, differently arranged, or additional components than depicted in FIGS. 1A and 1B. In still other implementations, one or more components of electronic device 100 may perform one or more other tasks described as being performed by one or more other components of electronic device 100.

Figure 2:
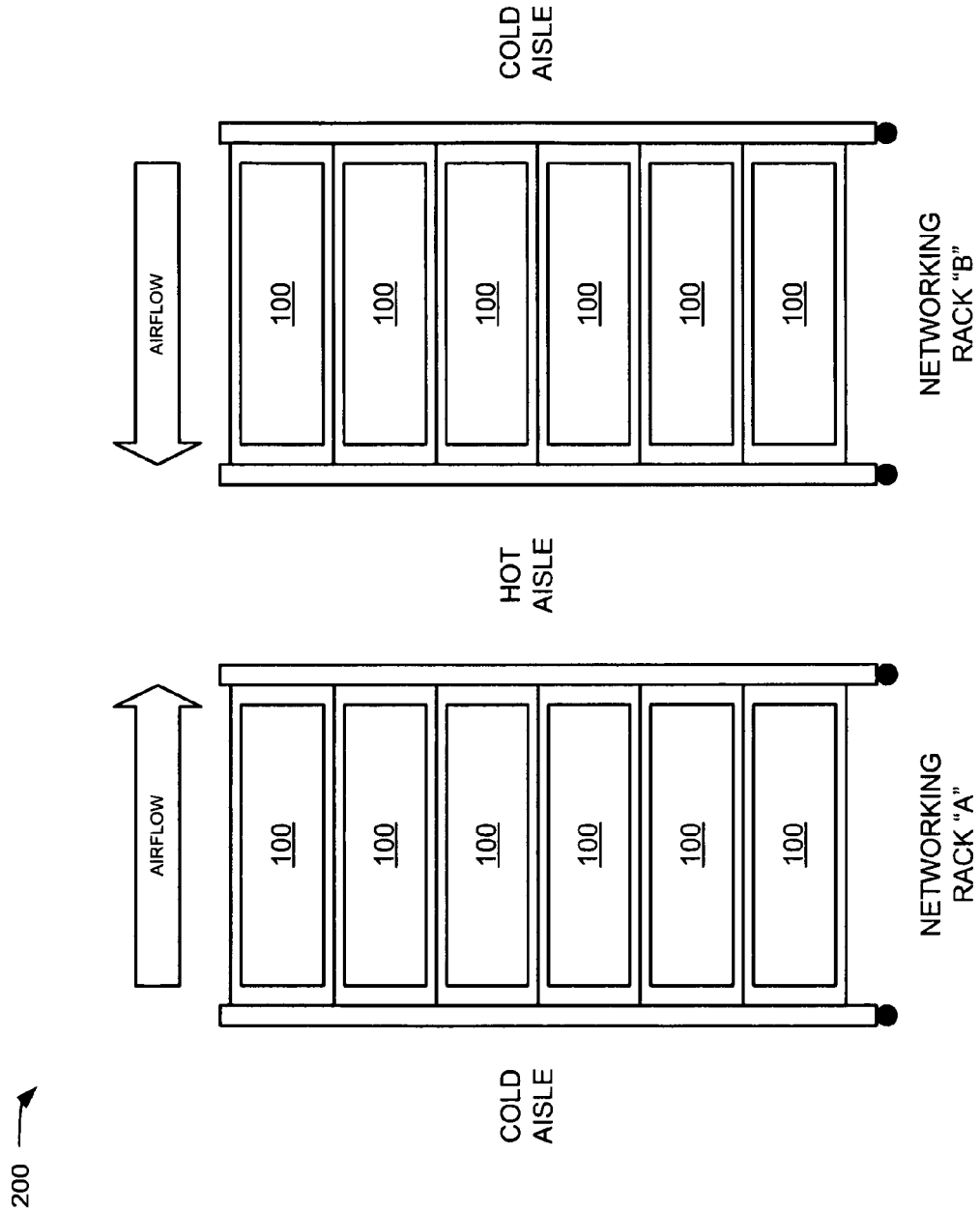
FIG. 2 illustrates a side view of an exemplary network rack system configured to accept multiple electronic devices.

FIG. 2 illustrates a side view of an exemplary network rack system 200 configured to accept multiple electronic devices 100. Rack system 200 may include multiple networking racks that may be arranged so that airflow though each electronic device 100 in the networking racks provides airflow from a cold aisle to a hot aisle. The arrangement of electronic devices 100 within a networking rack (e.g., to accommodate system upgrades, new requirements, etc.) may require reorientation (e.g., front-facing or rear-facing within a networking rack) or relocation (e.g., from one networking rack to another networking rack) of one or more electronic devices 100 while maintaining airflow from a cold aisle to a hot aisle. As described further herein, electronic device 100 may include reversible fan tray assembly 110 to quickly change (e.g., as a field modification) the airflow of electronic device 100 to permit a relocation and/or reorientation while maintaining networking rack airflow requirements.

In implementations described further herein, a field technician may install or reposition an electronic device 100 including reversible airflow fan tray assembly 110. To reverse the airflow in electronic device 100, the field technician may remove reversible airflow fan tray assembly 110 from electronic device 100, reposition the faceplate for the reversible airflow fan tray assembly 110, and reinstall reversible airflow fan tray assembly 110 in the opposite orientation to achieve a reversed airflow. Thus, modifications to the airflow of electronic device 100 can be made as a simple field change, allowing greater flexibility in the arrangement of electronic devices 100 network rack system 200. Also, modifications to the airflow of electronic device 100 can be made without the need for additional parts.

Exemplary Reversible Airflow Fan Tray Assembly

Figure 3:
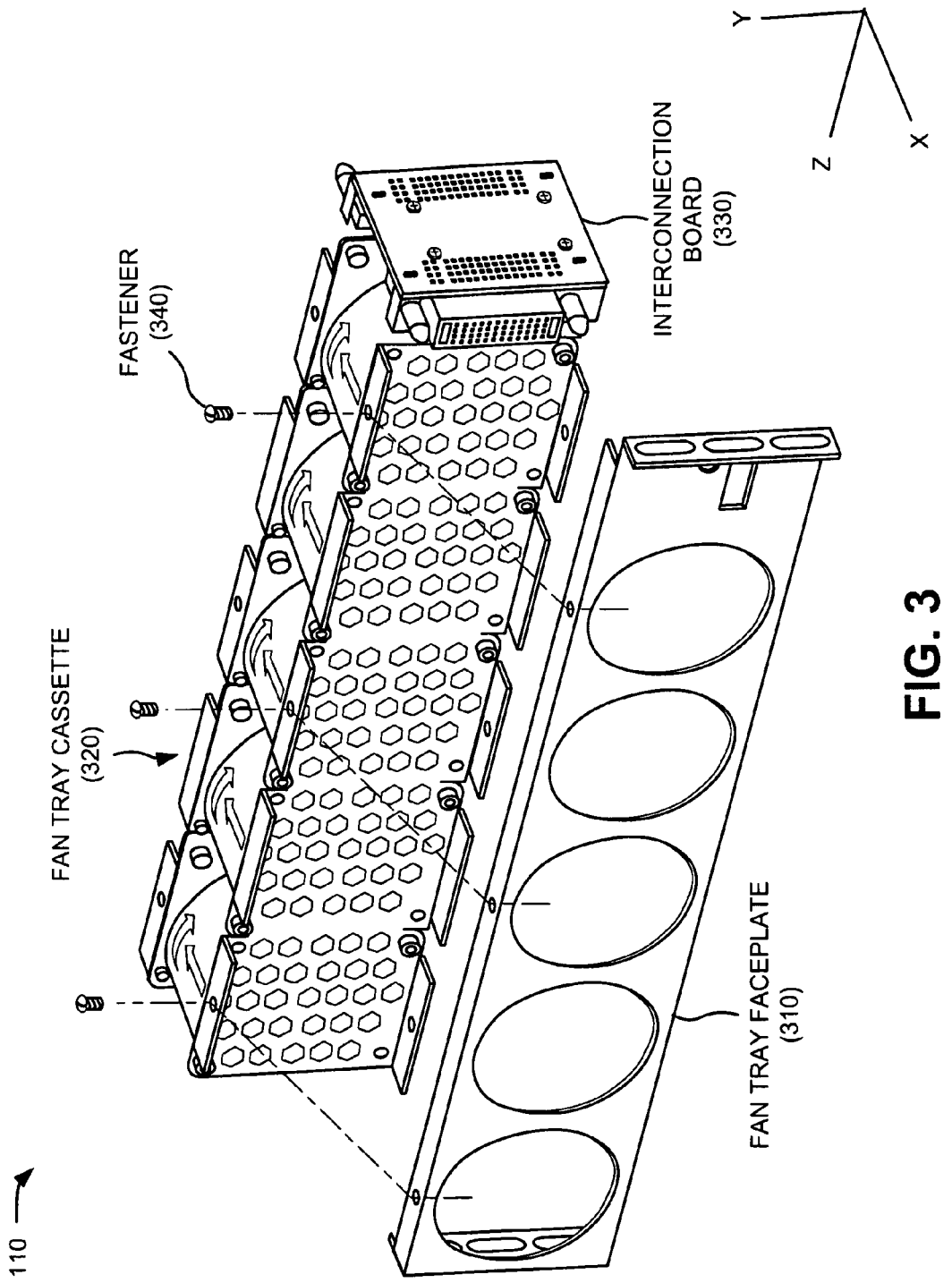
FIG. 3 illustrates an isometric view of an exemplary reversible airflow fan tray assembly.

FIG. 3 illustrates an isometric view of an exemplary reversible airflow fan tray assembly 110. As shown in FIG. 3, reversible airflow fan tray assembly 110 may include a fan tray face plate 310, a fan tray cassette 320, and an interconnection board 330.

Fan tray face plate 310 may provide a base to mount reversible airflow fan tray assembly 110 to electronic device 100 and/or to secure reversible airflow fan tray assembly 110 to other components of electronic device 100. Fan tray face plate 310 may attach to either side of fan tray cassette 320 using, for example, fasteners 340. Fan tray face plate 310 may have a single orientation with respect to electronic device 100. That is, fan tray face plate 310 may not be a reversible component of reversible airflow fan tray assembly 110 and may be configured to be secured in a single orientation to electronic device 100 (e.g., enclosure 150). Further details of fan tray face plate 310 are provided below in connection with, for example, FIG. 6.

Fan tray cassette 320 may include a housing for one or more fan units. In the exemplary implementation shown in FIG. 3, five (5) fan units are shown. The fan units may be secured together to form a single fan tray cassette 320. Fan tray cassette 320 may be symmetrically arranged so that fan tray cassette 320 may be secured to fan tray face plate 310 in two opposite orientations—with either a front surface or a rear surface of fan tray cassette 320 being secured to fan tray face plate 310. In one orientation (as shown in FIG. 3), fan tray cassette 320 may blow air away from fan tray face plate 310. In the other orientation, fan tray cassette 320 may blow air toward fan tray face plate 310. Further details of fan tray cassette 320 are provided below in connection with, for example, FIG. 5.

Interconnection board 330 may provide an electrical connection between the fan units and main system board 130 of electronic device 100. Interconnection board 330 may be configured to mate with a connector on the main system board when the fan cassette is in either orientation. Thus, interconnection board 330 may include two separate input/output (I/O) connectors that are arranged 180 degrees out of phase (with respect to a z-axis extending perpendicular to the plane of the PC board). Interconnection board 330 may provide an airflow direction indication to the main system board via, for example, inclusion of an open ground pin on one of the I/O connectors and a closed ground pin on the other of the I/O connectors. When fan tray face plate 310 is secured to fan tray cassette 320, a portion of fan tray face plate 310 may cover the unused I/O connector of interconnection board 330. Further details of interconnection board 330 are provided below in connection with, for example, FIGS. 4A and 4B.

Each of fasteners 340 may include a threaded bolt configured to engage corresponding threaded holes provided in fan tray face plate 310 and/or fan tray cassette 320. Fasteners 340 may connect fan tray face plate 310 to fan tray cassette 320 to form reversible airflow fan tray assembly 110. Alternatively and/or additionally, one or more of fasteners 340 may be replaced with a variety of other connection mechanisms, such as screws, adhesives, rivets, solder, and/or similar connection mechanisms. Although FIG. 3 shows three fasteners 340, in other implementations, reversible airflow fan tray assembly 110 may include more or fewer than three fasteners 340 to connect fan tray face plate 310 to fan tray cassette 320.

In implementations herein, reversible airflow fan tray assembly 110 may be reconfigured to provide airflow in the opposite direction by removing fan tray face plate 310 (e.g., by removing fasteners 340 that secure fan tray face plate 310 to fan tray cassette 320), flipping fan tray cassette 320 to the opposite side (e.g., rotating 180 degrees), and re-securing fan tray face plate 310 to fan tray cassette 320. Thus, reversible airflow fan tray assembly 110 may provide a single part (e.g., a single stock-keeping unit (SKU)) to accomplish two airflow directions for electronic device 100.

Although FIG. 3 shows exemplary components of reversible airflow fan tray assembly 110, in other implementations, reversible airflow fan tray assembly 110 may contain fewer, different, differently arranged, or additional components than depicted in FIG. 3. In still other implementations, one or more components of reversible airflow fan tray assembly 110 may perform one or more other tasks described as being performed by one or more other components of reversible airflow fan tray assembly 110.

Exemplary Interconnection Board

Figure 4A:
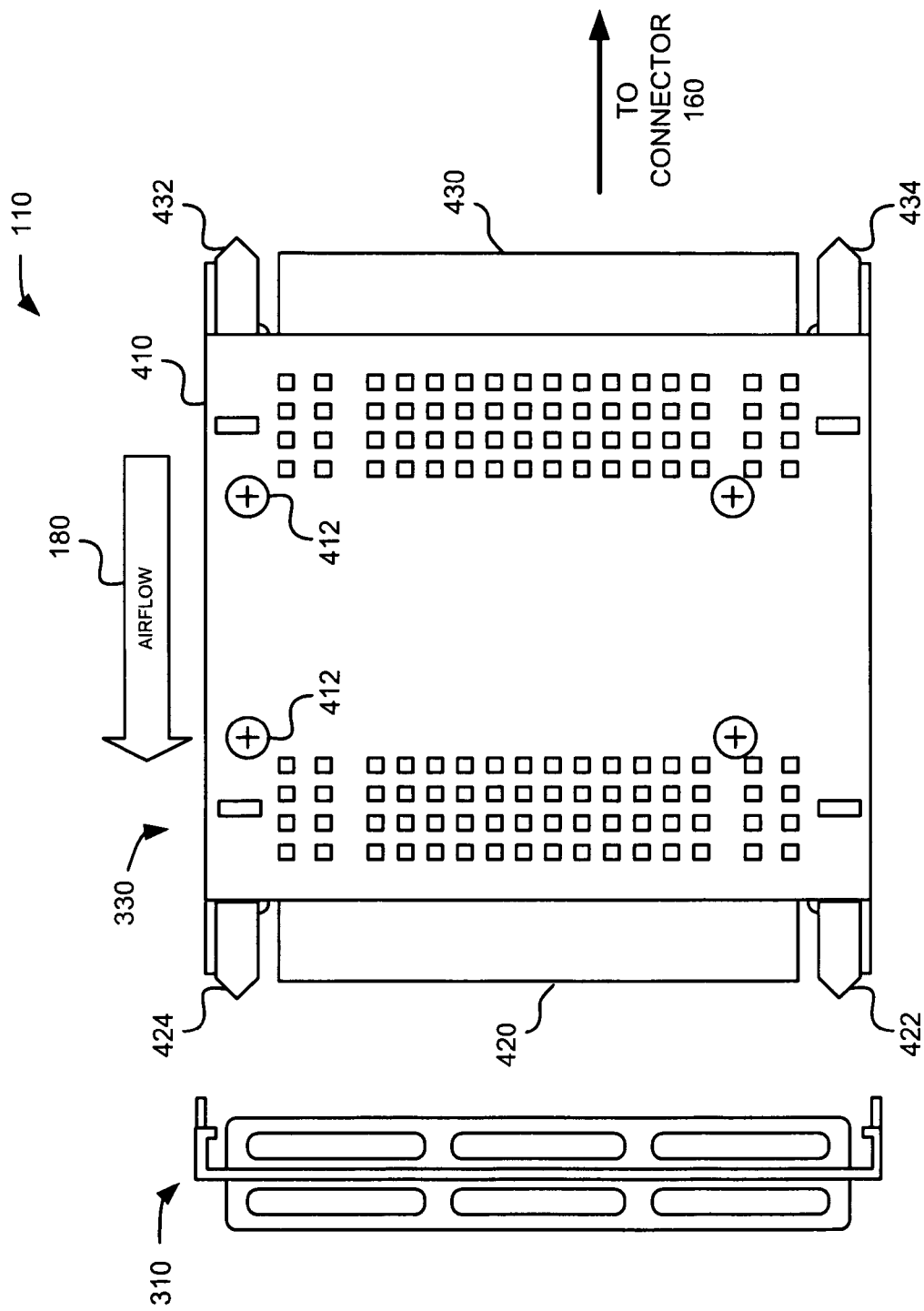
FIGS. 4A and 4B illustrate a side view of the exemplary reversible airflow fan tray in different orientations.
Figure 4B:
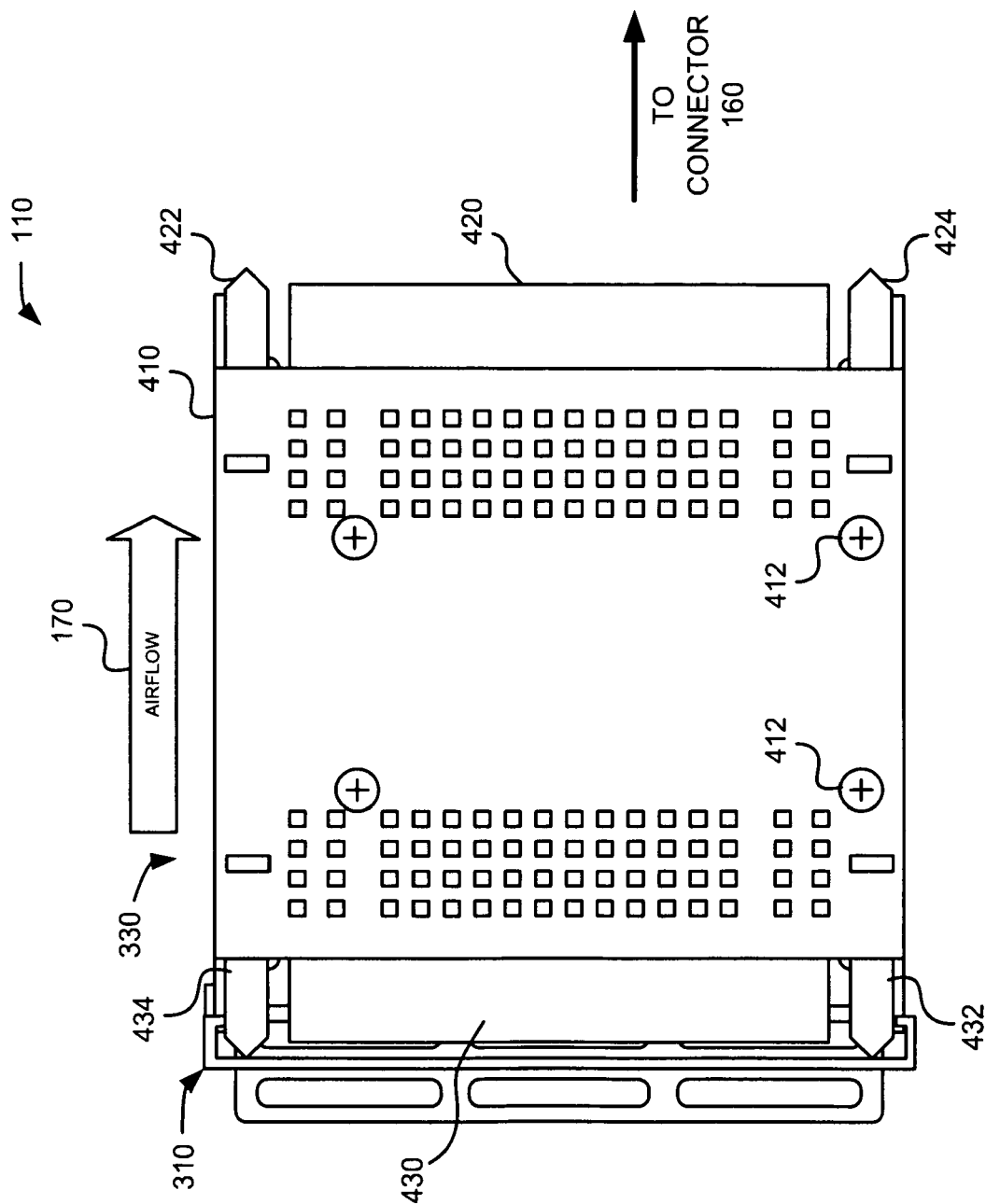

FIGS. 4A and 4B illustrate a side view of exemplary reversible airflow fan tray 110 to show interconnection board 330 in different orientations. FIG. 4A illustrates a side view of the airflow fan tray 110 oriented to provide airflow out of the back of electronic device 100 (illustrated by airflow indicator 180). Also in FIG. 4A, fan tray face plate 310 is shown removed from interconnection board 330 for clarity.

As shown in FIG. 4A, interconnection board 330 may include a printed circuit (PC) board 410 that may be mounted to fan tray cassette 320 (not visible in FIG. 4A) by, for example, fasteners 412. Interconnection board 330 may also include input/output (I/O) connectors 420 and 430. Each of fasteners 412 may include a threaded bolt configured to engage corresponding threaded holes provided in fan tray cassette 320. Alternatively and/or additionally, one or more of fasteners 412 may be replaced with a variety of other connection mechanisms, such as screws, adhesives, rivets, solder, and/or similar connection mechanisms. Although FIG. 3 shows four fasteners 412, in other implementations, interconnection board 330 may include more or fewer than four fasteners 412.

Input/output (I/O) connectors 420 and 430 may each include any device, mechanism and/or structure capable of making electrical power and/or signals available between fan tray cassette 320 and a component (e.g., main system board 130, power supply 120, etc.) having a mating connector (e.g., connector 160) associated therewith. In one implementation, I/O connectors 420 and 430 may each include a multi-pin connector configured and arranged to receive a mating connector mounted on a cable in communication with another component, such as a cable connected to main system board 130. For example, in the orientation of FIG. 4A where fan tray face plate 310 is mounted against I/O connector 420, I/O connector 430 may be electrically coupled to connector 160 so that fan tray assembly 110 may communicate with electronic device 100 and/or other components installed in electronic device 100. In one implementations, fan tray assembly 110 may convey to main system board 130 information that includes, for example, airflow direction, fan speed, power supply health, a serial number, a model number, and/or up (e.g., operational) time.

Input/output (I/O) connectors 420 and 430 may be arranged 180 degrees out of phase such that either of I/O connectors 420 or 430 may form a connection with connector 160 when oriented to face connector 160. I/O connector 420 and I/O connector 430 may each provide a different airflow direction indication to main system board 130 via, for example, inclusion of an open ground pin on one of the I/O connectors (e.g., I/O connector 420) and inclusion of a closed ground pin on the other I/O connectors (e.g., I/O connector 430). Thus, main system board 130 may be able to determine the installed airflow for fan tray assembly 110 and ensure airflow consistency with other components within electronic device 100 or with other electronic devices.

Upper guide post 432 and lower guide post 434 may be configured to receive alignment holes in connector 160 to ensure proper alignment of I/O connector 430 with the mating connector 160. Similarly, upper guide post 422 and lower guide post 424 may be configured to receive alignment holes in connector 160 to ensure proper alignment of I/O connector 420 with the mating connector 160. In one implementation, upper guide post 432 and upper guide post 422 may be configured with identical dimensions; while lower guide post 434 and lower guide post 424 may be configured with other identical dimensions. In another implementation, each of upper guide post 432, upper guide post 422, lower guide post 434, and lower guide post 424 may be configured with the same dimensions.

In the orientation of FIG. 4A, when fan tray face plate 310 is secured to fan tray cassette 320, a portion of fan tray face plate 310 may cover the unused I/O connector 420 of interconnection board 330 and I/O connector 430 may remain accessible to connector 160.

FIG. 4B illustrates a side view of the airflow fan tray 110 oriented to draw air into the back of electronic device 100 (illustrated by airflow indicator 170). Also in FIG. 4B, fan tray face plate 310 is shown attached to interconnection board 330 such that I/O connector 430 is covered by fan tray face plate 310.

Although FIGS. 4A and 4B show exemplary components of interconnection board 330, in other implementations, interconnection board 330 may contain fewer, different, differently arranged, or additional components than depicted in FIGS. 4A and 4B. In still other implementations, one or more components of interconnection board 330 may perform one or more other tasks described as being performed by one or more other components of reversible interconnection board 330.

Exemplary Fan Try Cassette

Figure 5:
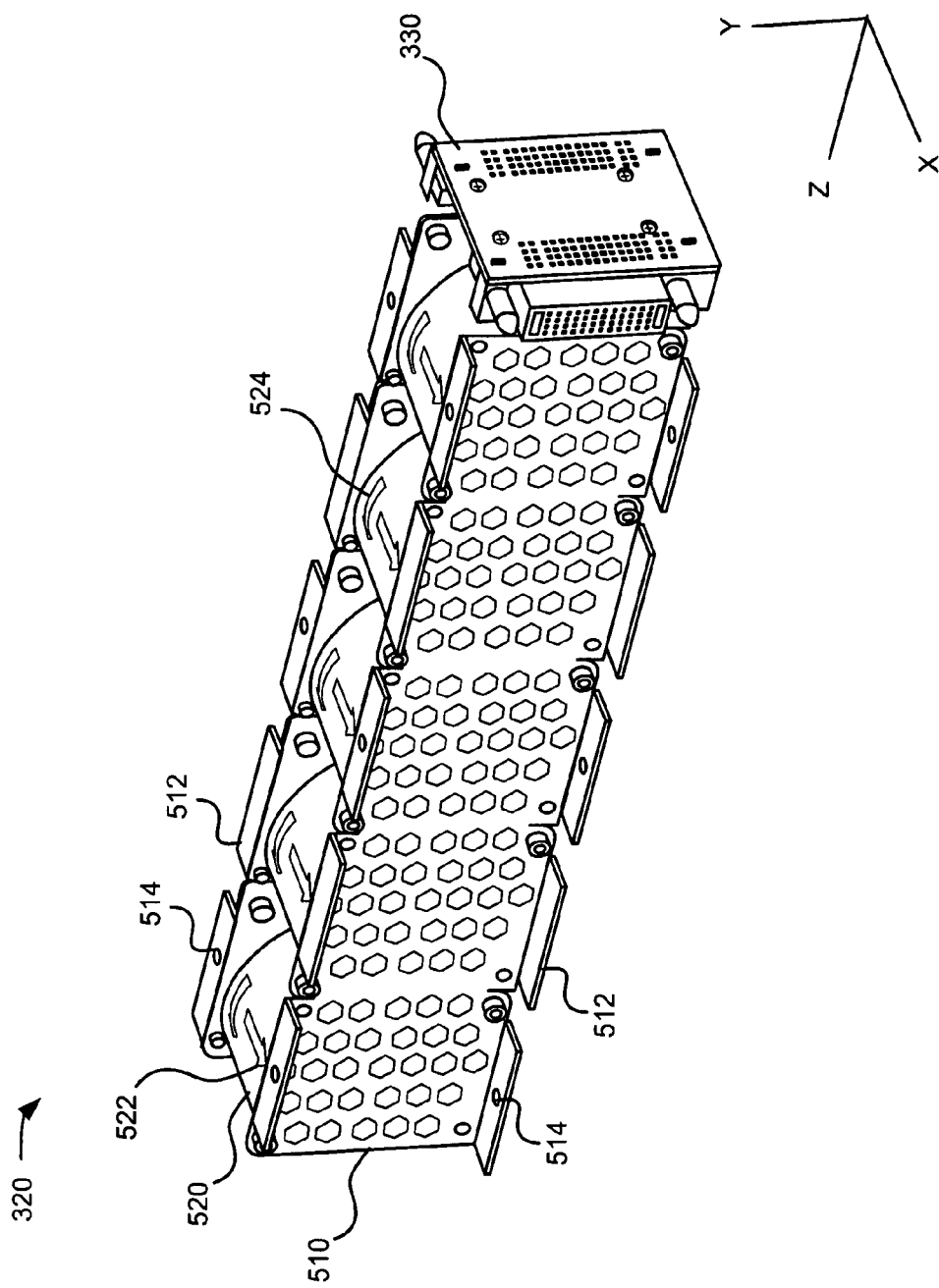
FIG. 5 illustrates an isometric view of an exemplary fan tray cassette for the reversible airflow fan tray assembly.

FIG. 5 illustrates an isometric view of fan tray cassette 320 for fan tray assembly 110. As shown in FIG. 5, fan tray cassette 320 may include two symmetrical mesh panels 510 securing between them multiple fan units 520.

Mesh panel 510 may include a device, mechanism and/or structure that may be configured to support fan units 520 and/or interconnection board 330 while allowing airflow through fan units 520. Mesh panel 510 may be fabricated from metal, plastic and/or composite and may be sized for particular applications (e.g., to accommodate a particular size and/or quantity of fan units 520). In one implementation, mesh panel 510 may be sized to fit an industry standard fan unit 520 and to fit within an electronic device, such as electronic device 100. In one implementation, mesh panel 510 may include a grid or collection of holes sufficient to permit air flow while preventing debris from entering fan tray assembly 110.

Mesh panel 510 may include one or more mounting flanges 512 to facilitate attachment of fan tray cassette 320 to a mounting structure, such as fan tray face plate 310. Some or all of mounting flanges 512 may include one or more mounting holes 514 for accepting fasteners (e.g., fasteners 340) for use in attaching fan tray cassette 320 to fan tray face plate 310. In one implementation, mounting holes 514 may be configured to accept standard machine screws that can be installed/removed by a technician using a standard screwdriver. Mesh panel 510 may also include one or more other mounting flanges to facilitate attachment of interconnection board 330 to mesh panel 510.

Fan units 520 may include a device, mechanism and/or structure that may be used to draw air in and/or expel air from electronic device 100. In an exemplary implementation, each fan unit 520 may include an identical standard 20 mm or 40 mm ball bearing fan. In some implementations fan unit 520 may include a separate filter in addition to mesh panel 510. Each fan unit 520 may include airflow direction indicator 522 and fan blade rotation indicator 524 to allow a user to visually determine the airflow direction for a particular orientation of fan tray cassette 320. In one implementation, airflow direction indicator 522 and fan blade rotation indicator 524 may be etched into both a top and bottom surface of each fan unit 520.

The quantity and size of fan units 520 (and the corresponding size of mesh plane 510) may be configured based on, for example, the required airflow capacity of electronic device 100. Thus, while five fan units 520 are shown in FIG. 5, additional or fewer fan units 520 may be used in other implementations. Also, different sized fan units 520 may be used within the same fan tray cassette 320.

Although FIG. 5 shows exemplary components of fan tray cassette 320, in other implementations, fan tray cassette 320 may contain fewer, different, differently arranged, or additional components than depicted in FIG. 5. In still other implementations, one or more components of fan tray cassette 320 may perform one or more other tasks described as being performed by one or more other components of fan tray cassette 320.

Exemplary Fan Tray Face Plate

Figure 6A:
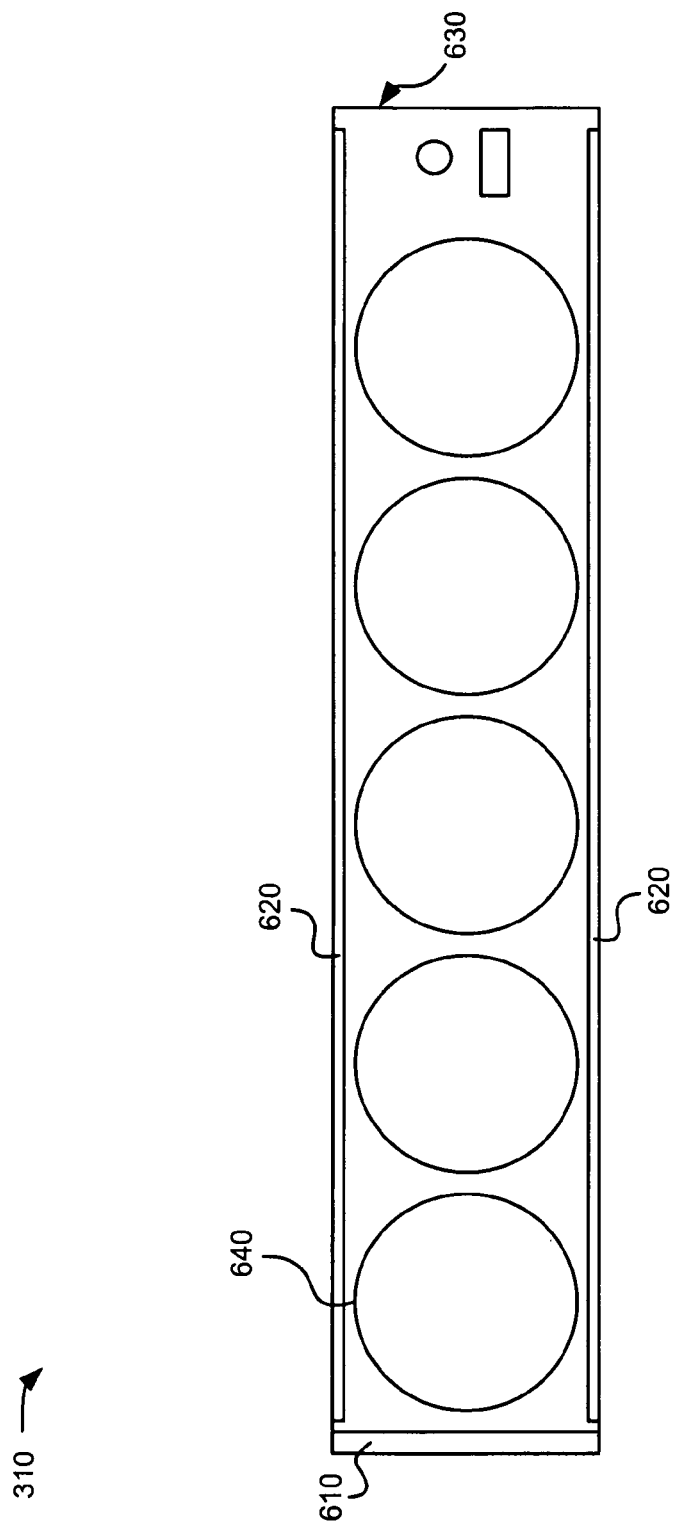
FIGS. 6A and 6B illustrate a rear view and an isometric view, respectively, of an exemplary fan tray face plate for the reversible airflow fan tray assembly.
Figure 6B:
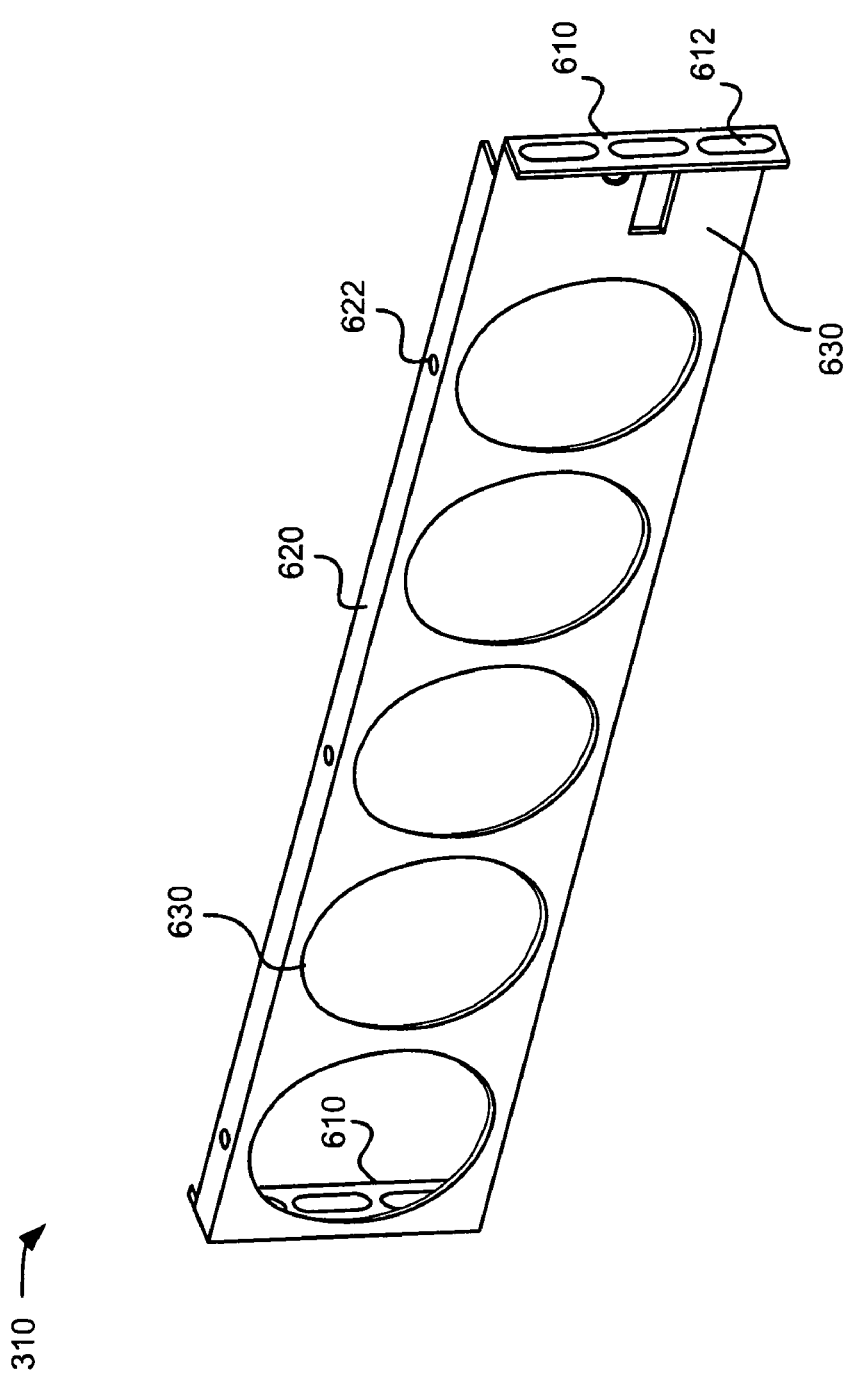

FIGS. 6A and 6B illustrates a rear view and an isometric view, respectively, of fan tray face plate 310 for reversible airflow fan tray assembly 110. Fan tray face plate 310 may include any structure that may be configured to be removably attached to fan tray cassette 320 and to electronic device 100 (e.g., enclosure 150). Fan tray face plate 310 may be fabricated from metal, plastic and/or composite and may be sized for particular applications, such as an opening within a rear panel of electronic device 100. In one implementation, fan tray face plate 310 may be sized to fit an industry standard mounting structure within electronic device 100 or another component within electronic device 100.

Fan tray face plate 310 may include one or more mounting flanges 610 to facilitate attachment of fan tray face plate 310 to a mounting structure, such as enclosure 150 of electronic device 100 or another component within electronic device 100. The mounting flange 610 may include one or more mounting holes 612 (FIG. 6B) for accepting fasteners, such as machine screws, for use in attaching electronic device 100 to the mounting structure.

Fan tray face plate 310 may also include one or more mounting flanges 620 to facilitate attachment of fan tray face plate 310 to fan tray cassette 320. Mounting flange 620 may include one or more mounting holes 622 (FIG. 6B) for accepting fasteners (e.g., fasteners 340) for use in attaching fan tray cassette 320 to fan tray face plate 310. In one implementation, mounting holes 622 may be configured to accept standard machine screws that can be installed/removed by a technician using a standard screwdriver. Thus, fan tray face plate 310 may be mounted to either side of fan tray cassette 320 to form a fan tray assembly 110 that, in one orientation, may draw air into the back of electronic device 100 or, in the opposite orientation, may expel air out the back of electronic device 100. Fan tray face plate 310 may also include a portion 630 that may cover an unused I/O connector of interconnection board 330 and openings 640 to correspond to each fan unit 520 of fan tray cassette 320.

Although FIGS. 6A and 6B show an exemplary implementation of fan tray face plate 310, in other implementations, fan tray face plate 310 may contain different, differently arranged, or additional features than depicted in FIGS. 6A and 6B.

Exemplary Process

FIG. 7 is a flowchart of an exemplary process 700 for reversing the air flow for an electronic device according to implementations described herein. As shown in FIG. 7, process 700 may include determining a required airflow direction for an electronic device (block 710), and identifying a different current airflow direction (block 720). For example, in implementations described above in connection with FIGS. 1A, 1B and 2, a field technician may install or reposition an electronic device 100 including reversible airflow fan tray assembly 110. Electronic device 100 may have an existing airflow that, due to a change in position, must be reversed to meeting required airflow configurations.

As further shown in FIG. 7, the reversible airflow fan tray assembly may be disconnected (block 730). For example, in implementations described above in connection with FIGS. 4A, 4B, 6A and 6B, fasteners may be removed from mounting holes 612 in mounting flanges 610 on fan tray face plate 310 to detach face plate 310 from electronic device 100. With the fasteners removed, I/O connector 420 may be detached from mating connector 160 to allow removal of reversible airflow fan tray assembly 110.

The fan tray face plate may be removed from the reversible airflow fan tray assembly (block 740). For example, in implementations described above in connection with FIG. 3, fasteners 340 may be removed from reversible airflow fan tray assembly 110 to allow fan tray face plate 310 to be removed from fan tray cassette 320.

The fan tray cassette may be rotated so that the fan tray face plate may be reconnected (block 750) and the reversible airflow fan tray assembly may be replaced (block 760). For example, in implementations described above in connection with FIGS. 1A, 1B and 3, fan tray cassette 320 may be flipped to the opposite side (e.g., rotated 180 degrees around the z-axis) and fan tray face plate 310 may be reattached to fan tray cassette 320 using fasteners 340. Reversible airflow fan tray assembly 110 will now be oriented in the opposite direction of the original airflow. The exposed I/O connector (e.g., I/O connector 420 or I/O connector 430) of interconnection board 330 on reassembled reversible airflow fan tray assembly 110 may be reconnected to mating connector 160. Fasteners may be replaced through mounting holes 612 in mounting flanges 610 on fan tray face plate 310 to reattach face plate 310 to electronic device 100.

CONCLUSION

Implementations described herein may provide a reversible airflow fan tray assembly for an electronic device. The fan tray assembly may include a face plate to be removably mounted to the electronic device and a fan tray cassette to be removably mounted to the face plate in opposite orientations. The fan tray cassette may include a fan unit to provide airflow through the electronic device, and an interconnection board to provide an electrical connection between the fan unit and the electronic device, where the interconnection board can mate with a connector on the electronic device when the fan tray cassette is in either of the opposite orientations. The interconnection board may provide an airflow direction indication to the electronic device for a current orientation of the opposite orientations.

The foregoing description of implementations provides illustration and description, but is not intended to be exhaustive or to limit the invention to the precise form disclosed. Modifications and variations are possible in light of the above teachings or may be acquired from practice of the invention.

For example, while fan tray assembly 110 has been described as being in one of two possible orientations, in other implementations, fan tray assembly 110 may have more than two possible orientations within an electronic device (e.g., airflows oriented through a top, bottom, left, right, back, front and combinations thereof). Also, while a series of blocks has been described with regard to FIG. 7, the order of the blocks may differ in other implementations. Further, non-dependent blocks may be performed in parallel.

Also, systems described herein can be implemented using assemblies and parts other than those illustrated in the figures and described in the specification without departing from the spirit of the invention. Parts may be added and/or removed from electronic device 100 and/or fan tray assembly 100 depending on specific deployments and/or applications. Further, disclosed implementations may not be limited to any specific combination of hardware.

No element, act, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A reversible airflow fan tray device for an electronic device, the fan tray device comprising:
    a face plate to be removably mounted to the electronic device; and
    a fan tray cassette to be removably mounted to the face plate in a plurality of orientations, the fan tray cassette comprising:
        a fan unit to provide airflow through the electronic device, and
        an interconnection board to provide an electrical connection between the fan unit and the electronic device, where the interconnection board mates with a connector on the electronic device when the fan tray cassette is in any of the plurality of orientations.

2. The device of claim 1, where the interconnection board provides an airflow direction indication to the electronic device for a current orientation of the plurality of orientations.

3. The device of claim 1, where the fan tray cassette further comprises a mesh panel to secure multiple fan units and the interconnection board.

4. The device of claim 1, where the fan unit includes one of:
    an airflow direction indicator, or
    a fan rotation indicator.

5. The device of claim 1, where the interconnection board comprises:
    a first input/output connector to provide a connection when the fan tray cassette is in one of the plurality of orientations, and
    a second input/output connector to provide a connection when the fan tray cassette is in another of the plurality of orientations.

6. The device of claim 5, where the faceplate comprises a portion to cover an unused one of the first and second input/output connectors of interconnection board.

7. The device of claim 5, where the first input/output connector includes an open ground pin to identify one of the plurality of orientations, and the second input/output connector includes a closed ground pin to identify another of the plurality of orientations.

8. An electronic device, comprising:
    an enclosure to retain components of the electronic device;
    a fan tray assembly removably mounted to the enclosure of electronic device, where the fan tray assembly may be positioned in either of two orientations, the first orientation to draw external air into the electronic device and the second orientation to force internal air out of the electronic device; and
    a main system board operatively connected to the reversible fan tray assembly to identify which of the first and second orientations is currently installed.

9. The electronic device of claim 8, further comprising:
a connector to allow the main system board to communicate with the fan tray assembly and to provide power from a power supply to the fan tray assembly.

10. The electronic device of claim 8, where the fan tray assembly further comprises:
a fan unit to provide airflow through the electronic device, and
an interconnection board to provide an electrical connection between the fan unit and the main system board, where the interconnection board is configured to mate with a connector on the main system board when the fan tray assembly is in either of the two orientations.

11. The electronic device of claim 10, where the fan tray assembly further comprises:
a mesh panel to secure multiple fan units and the interconnection board.

12. The electronic device of claim 10, where the fan unit includes one of:
an airflow direction indicator, or
a fan rotation indicator.

13. The electronic device of claim 8, where the fan tray assembly further comprises:
a first input/output connector to provide a connection when the fan tray assembly is in the first orientation, and
a second input/output connector to provide a connection when the fan tray assembly is in the second orientation.

14. The electronic device of claim 13, where the first input/output connector includes an open ground pin to identify the first orientation, and the second input/output connector includes a closed ground pin to identify the second orientation.

15. The electronic device of claim 8, where the electronic device comprises one of:
a system controller,
a server,
a router,
a switch,
a firewall, or
a network address translator.

16. A fan tray assembly, comprising:
means for removably mounting the fan tray assembly to an electronic device;
means for operatively connecting the fan tray assembly to the electronic device in a first orientation, where the first orientation provides airflow through the electronic device in one direction;
means for operatively connecting the fan tray assembly to the electronic device in a second orientation, where the second orientation provides airflow through the electronic device in another direction; and
means for providing an airflow direction indication to the electronic device for the first orientation or the second orientation.

17. The fan tray assembly of claim 16, further comprising:
means for visually indicating the first orientation or the second orientation to a user.

18. A method for reversing airflow through an electronic device having a reversible fan tray assembly, the method comprising:
determining an airflow direction for the electronic device;
identifying a different current airflow direction for the electronic device;
disconnecting the reversible fan tray assembly from the electronic device;
removing a fan tray face plate from a first orientation of the reversible fan tray assembly;
securing the fan tray face plate on a second orientation of the reversible fan tray assembly; and
reconnecting the reversible airflow assembly to the electronic device.

19. The method of claim 18, where the reversible fan tray assembly comprises an interconnection board that provides an airflow direction indication to the electronic device for the first and second orientation.

20. The method of claim 18, where the first orientation causes the reversible fan tray assembly to draw external air into the electronic device and the second orientation causes the reversible fan tray assembly to force internal air out of the electronic device.

* * * * *